United States Patent [19]
Je-Chang et al.

[11] Patent Number: 5,495,244
[45] Date of Patent: Feb. 27, 1996

[54] DEVICE FOR ENCODING AND DECODING TRANSMISSION SIGNALS THROUGH ADAPTIVE SELECTION OF TRANSFORMING METHODS

[75] Inventors: Jeong Je-Chang; Kim Sung-Bong, both of Seoul, Rep. of Korea

[73] Assignee: Samsung Electronics Co., Ltd., Kyungki-do, Rep. of Korea

[21] Appl. No.: 322,037

[22] Filed: Oct. 12, 1994

Related U.S. Application Data

[63] Continuation of Ser. No. 986,062, Dec. 4, 1992, abandoned.

[30] Foreign Application Priority Data

Dec. 7, 1991 [KR] Rep. of Korea ............... 91-22380

[51] Int. Cl.$^6$ ................................................. H03M 7/00
[52] U.S. Cl. ......................................... 341/51; 348/404
[58] Field of Search ............................. 341/51; 358/133, 358/135, 136; 348/403, 404

[56] References Cited

U.S. PATENT DOCUMENTS

| | | | |
|---|---|---|---|
| 3,754,128 | 8/1973 | Corinthios | 364/726 |
| 4,772,947 | 9/1988 | Kono | 358/133 |
| 4,894,713 | 1/1990 | Delogne et al. | 358/133 |
| 4,999,705 | 3/1991 | Puri | 358/136 |
| 5,134,396 | 7/1992 | Sirat et al. | 341/51 |
| 5,235,623 | 8/1993 | Sugiyama et al. | 341/67 |

*Primary Examiner*—Howard L. Williams
*Attorney, Agent, or Firm*—Sughrue, Mion, Zinn, Macpeak & Seas

[57] ABSTRACT

A device is provided for encoding and decoding transmitted signals through adaptive selection of different transform methods. An original signal or a predicted error signal having at least one dimension is input in parallel to a plurality of different transforms. The total energy level of coefficients, corresponding to low frequency components, from each transform is measured and compared. The output of the transform having the largest energy, is selected and encoded for transmission, and thereafter the transmission signal is decoded. The device maximizes encoding and decoding efficiencies.

16 Claims, 2 Drawing Sheets

DEVICE FOR ENCODING AND DECODING TRANSMISSION SIGNALS THROUGH ADAPTIVE SELECTION OF TRANSFORMING METHODS

This is a continuation of application Ser. No. 07/986,062 filed Dec. 4, 1992 now abandoned.

FIELD OF THE INVENTION

The present invention relates to a device for encoding and decoding a transmission signal, and more particularly to a device for encoding and decoding through adaptive selection of one among several transforms after an original or a predicted error signal, having one or more dimensions, are input in parallel to these transforms. After performing each transform, the total energy coefficients are measured, each of which corresponds to low frequency components of the block of transformed signals. A transformer output, having the largest energy, is selectively encoded for transmission, and thereafter the transmitted signals are decoded.

BACKGROUND OF THE INVENTION

Generally, block encoding is a highly-efficient encoding method for upgrading transmission efficiency of a video signal. The block encoding method, which is based on a strong correlation between a picture signal and a sampled value adjacent thereof, accumulates and blocks a predetermined number of samples of picture signals and performs compression in each block. This kind of block encoding method is divided into a transform encoding method which transforms the sampled values within a block for quantization, and a vector quantizing method which quantizes the transformed sample values in each block unit. The transform encoding method is based on the correlation between video signals in minor domains of the screen. During the transform encoding method, pixel values of each minor domain are converted to columns of numerical values. Transform coefficients are obtained from these numerical columns and thus, represent components of the original or predicted error signal ranging from a low frequency to a high frequency.

In this kind of transform encoding method, various transforms may be used for transforming an incoming signal, such as DCT (Discrete Cosine Transform), Hadamard Transform, Haar Transform, KLT (Karhunen-Loeve Transform), BTC (Block Truncation Coding), and the like. The efficiency of these transforms is conventionally expressed in terms of energy packing efficiency (EPE). An EPE is expressed as an energy ratio between a transform energy of M×M' units and a transform energy of N×N' units, where the M×M' units are selected out of N×N' units (M or M'<N or N'). The efficiency of a transform having a larger EPE is regarded as excellent. The following is an equation expressing the EPE in a two dimensional method.

$$EPE = \frac{\sum_{u=0}^{M-1}\sum_{v=0}^{M'-1} E[F(u, v)]}{\sum_{u=0}^{N-1}\sum_{v=0}^{N'-1} E[F(u, v)]}$$

where, E[F(u, v)] is the energy level from the transform coefficient F(u, v).

The KLT transform method has the largest EPE of the above noted transform methods, but this kind of transform is impossible to realize through hardware used by the above-noted conventional transform encoding methods. The DCT transform is used as the nearest method to the KLT method for creating a large EPE. However, the EPE characteristic of the DCT method decreases under certain transform conditions. Transforms other than the DCT method, can often provide a better EPE characteristic depending on the incoming signal patterns. For instance, when a picture signal's correlation is less than 0.5, the DST method is more efficient than the DCT method.

As seen by the foregoing, various transform methods have been utilized to improve encoding efficiency. However, when a single transform is used for all incoming signal patterns the EPE decreases, thus preventing the use of an effective correlation method.

SUMMARY OF THE INVENTION

Accordingly, it is an object of the present invention to provide an encoding device which can maximize encoding efficiency by utilizing various kinds of transforms and by selectively adapting the transform to provide the highest EPE for an encoded signal.

It is another object of the present invention to provide a decoding device of a signal encoded by the present encoding device.

The present encoding device for adaptive selection of encoding transforms comprises: transforming means having at least two different transforms for transforming received signals to transmission data after receiving the signals separately, energy detection means for detecting energy from the transmission data output by respective transforms of the transforming means and for outputting an address signal of a transform having the highest energy; and a multiplexer for outputting selectively a signal having the highest energy of the outputs of respective transforms of the transforming means based on an address signal output from the energy detection means.

The present decoding device for adaptive selection of decoding transforms comprises: inverse transforming means having at least two mutually different inverse transforms for inversely transforming received transmission data; and a multiplexer for outputting one inversely transformed signal output by the inverse transforming means based on the transmitted address signal.

BRIEF DESCRIPTION OF THE DRAWINGS

For a fuller understanding of the nature and objects of the present invention, reference should be made to the following detailed description of the preferred embodiment taken in connection with the accompanying drawings in which.

DETAILED DESCRIPTION OF THE INVENTION

Figure 1:
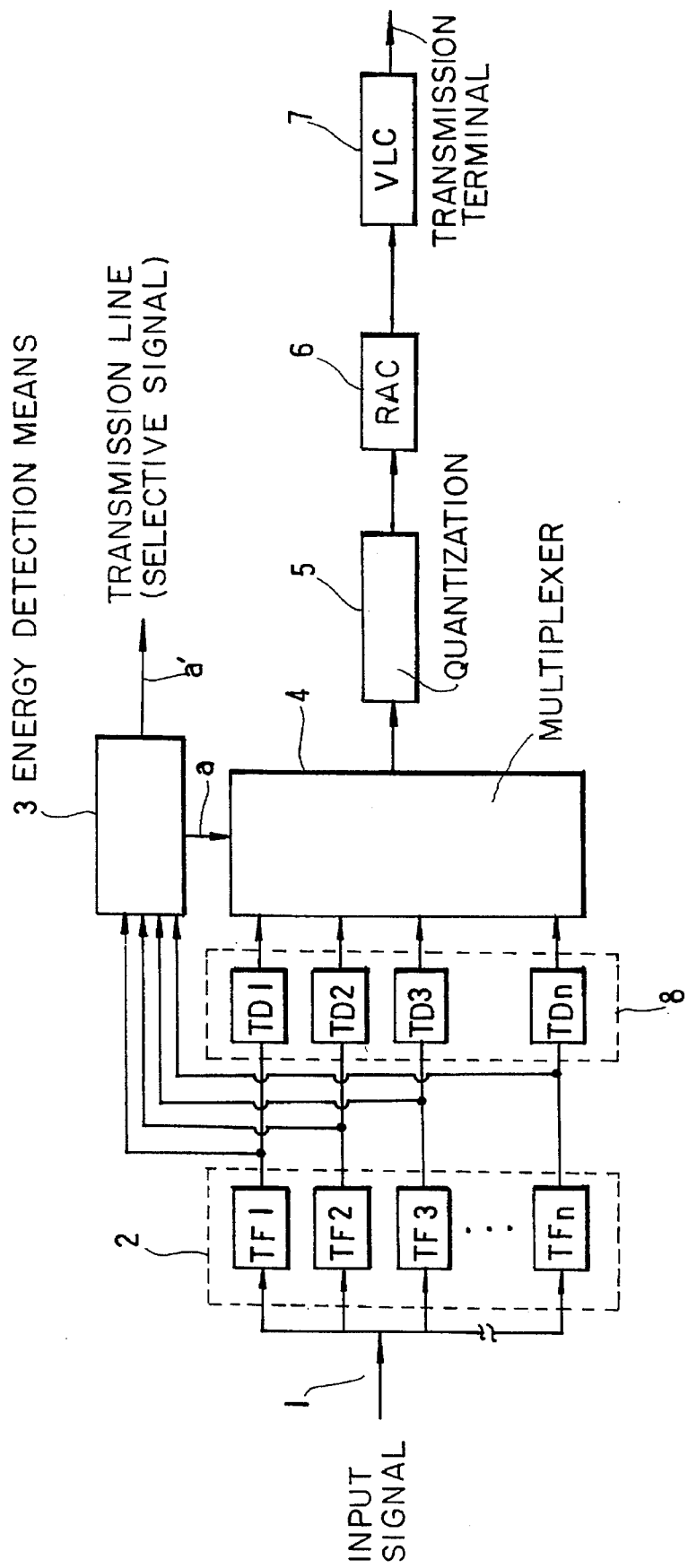
FIG. 1 is a block diagram of an encoding device that adaptively selects different transforming methods in accordance with the present invention.

In FIG. 1, an incoming signal 1 is an original signal or an error signal having at least one dimension. At this location, the error signal is a difference component between a present block of the input signal and a previous block of the input signal which is stored in a frame memory within a predicted differential pulse code modulation (DPCM) loop. Transforming means 2 comprises a plurality of transforms (TF1, TF2, ... TFn), each of which constitutes a different type of transform. For instance, TF1 can be a DCT, TF2 can be a DST, TF3 can be a Hadamard Transform and TFn can be a Haar Transform. The input signal 1 is parallelly input to the transforms TF1, TF2 ... TFn. Energy detection means 3 detects energy levels of output signals from each transform TF1, TF2 ... TFn, compares the detected energy levels and generates selective signals a, a' to select a transform having the highest energy. The theory of operation of the energy detection means 3 is explained in more detail in a book entitled "Discrete Cosine Transform," co-authored by K. R. Rao and P. Yip, published by Academic Press, at pages 123 to 128. The book "Discrete Cosine Transform" is incorporated herein by reference. The multiplexer 4, having an input-output ratio of n:1, is controlled by a select signal a generated by the energy detection means 3, and outputs one of the transforms TF1, TF2 ... TFn.

Time delaying means 8 comprises delays TD1 ... TDn and is connected between the transforming means 2 and the multiplexer 4. The delay TD1 ... TDn delay the output of the transforming means 2 during a time t when a selective signal a is generated from the energy detection means 3. A signal selected from the multiplexer 4 is transmitted to a transmission terminal through quantization means 5, a run amplitude converter (RAC) 6 and variable length coding (VLC) means. The operation of the present encoding device illustrated in FIG. 1 is explained hereunder in detail with reference to the transform domain drawing in FIG. 2.

When an original signal or an error signal, having at least one dimension, is input in parallel to respective transforms TF1, TF2 ... TFn, the transforming means 2 transforms the original signal into a frequency domain in accordance with transform modules of respective transforms for an output. The input signal 1 is a pre-blocked signal and thus, when a two dimensional signal is received, the input signal is blocked into N×M size units. Accordingly, when an input signal 1 having a block size of N=8 and M=8 is received, this kind of input signal is transformed into the frequency domain at respective transforms TF1, TF2, . . . TFn in accordance with transform modules. The transformed signal is output as a coefficient having a size of 8×8 just like the input signal.

Figure 2:
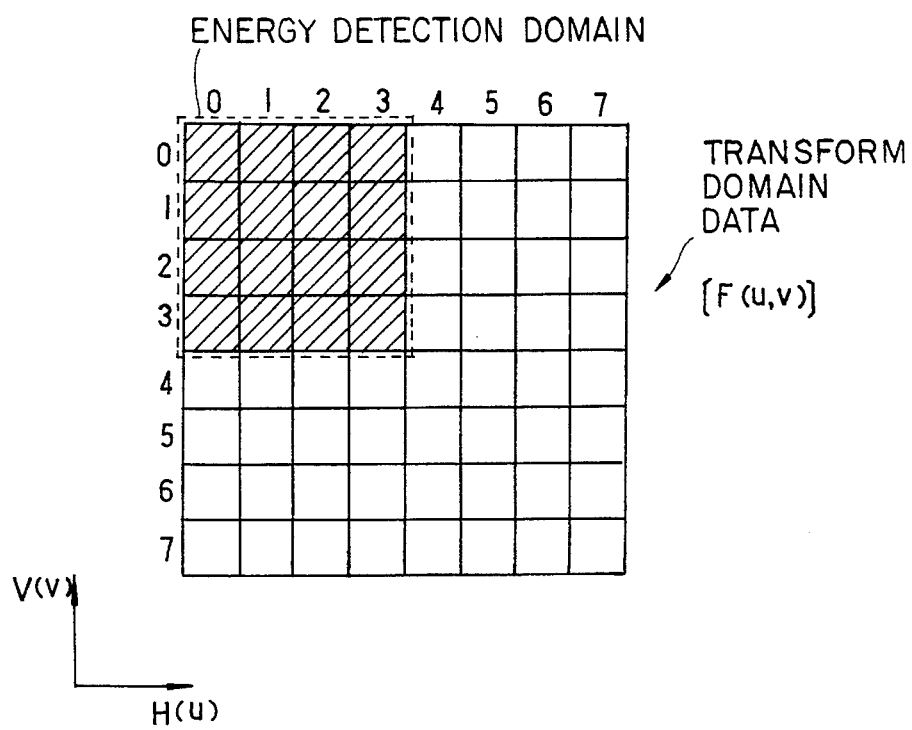
FIG. 2 is a transform domain drawing representing an energy detection domain.

Picture information transformed into the frequency domain by the respective transforms of transforming means 2 is expressed in FIG. 2. As illustrated in FIG. 2, the frequency signal components are separated into low frequency components and high frequency components. The picture information has in general more low frequency components than high frequency components. Thus, quantization is realized in such a way that more bits should be allocated to the low frequency components than to the high frequency components. This bit allocation reduces the information quantity to be transmitted by eliminating bits from the high frequency components.

All the coefficients thus output from respective transforms TF1, TF2 ... TFn are input to a multiplexer 4 through time delaying means 8, and the data of the energy detection domain is input to the energy detection means. The energy detection domain in the present invention covers a portion of the entire domain ranging from F(0,0) to F(3,3) and the coefficients of the energy detection domain corresponding to the low frequency is input to the energy detection means 3. Energy detection means 3 detects the energy levels of respective output signals in order to compare energy magnitudes of each transform TF1, TF2 ... TFn.

At this point, if energy detection were performed based on all of the transform coefficients, identical values would appear for the various transforms of the present block of energy of the input signal which is meaningless for comparison. Further, as the picture information primarily resides in the low frequency domain, the energy detection is performed based on a predetermined low frequency domain. In other words, the energy is detected based on a portion of the domain from F(0,0) to F(3,3) as shown in FIG. 2 with oblique lines.

Energy detection means 3 detects and compares the energy levels from low frequency domain components of the output signals of respective transforms. The energy detection means uses mutual comparison as a basis for selecting the highest energy and generates selective signals a and a', accordingly. The selective signals a and a', if four kinds of transforms are used, can be displayed in 2-bits of information. The selective signal a generated from the energy detection means 3 is supplied to the multiplexer 4 and the other selective address signal a' which has been processed (amplified) for transmission is output to a transmission terminal. The multiplexer 4, into which the address signal a has been input, selectively outputs a transformed picture information signal, having the highest energy in the low frequency domain, output from respective transforms of the transforming means 2.

A predetermined time t is needed to perform energy detection and comparison at energy detection means 3. Accordingly, time delaying means 8 is connected, in the signal transmission route input from respective transforms TF1, TF2 . . . TFn to the multiplexer 4, for delaying the output of the transforms for compensation time t. If necessary, the signal of the frequency domain output from the multiplexer 4 passes through an additional vector or scalar quantization means 5 and RAC 6 in order to further improve the encoding efficiency. The signal is also data-compressed at VLC 7 before being sent to the transmission terminal.

Conversely, in order to decode encoded information which has passed through the above selective transform procedures, a procedure is followed that corresponds reversely to the block diagram in FIG. 1. In order to achieve the foregoing, the selective signal a' of the transform at the energy detection means 3 is also transmitted through the transmission terminal. The decoding device receives this selective signal a' for decoding the transmitted data.

Figure 3:
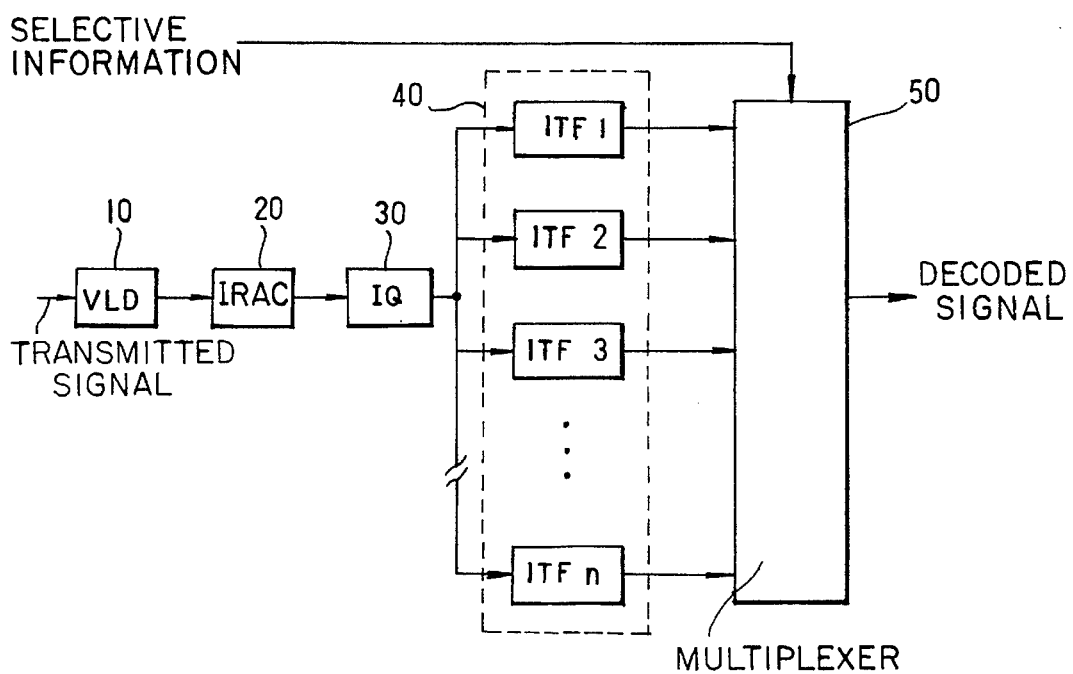
FIG. 3 is a block diagram of a decoding device that adaptively selects an inverse transform in accordance with the present invention.

According to FIG. 3, the transmitted signal encoded by the encoding device (as depicted in FIG. 1) is variable-length-decoded at variable length decoding (VLD) means 10. The signal decoded at the VLD means 10 is transformed into an original bit stream through inverse run amplifier transforming means 20. The signal, which has been transformed into a bit stream at the inverse run amplifier converting means 20, is inverse-quantized at inverse quantization means 30. The inverse-quantized signal is input to inverse transforming means 40, having a plurality of inverse transforms ITF1, TF2 . . . ITFn, corresponding to the transforms in transforming means 8 in FIG. 1. The signal, input in parallel to respective inverse transforms of the inverse transforming means 40, is inversely transformed and is outputted to a multiplexer 50. The selective signal a' generated from the energy detection means 3 of FIG. 1 is input to the multiplexer 50 through a transmission line. The multiplexer 50 outputs only the inverse transform signal of the inverse transforms ITF1–ITFn identified by the selective signal a' out of the inversely transformed signals output from the inverse transforming means 40. Accordingly, a decoded signal is obtained.

As illustrated in the foregoing, the present invention provides for encoding and decoding through adaptive selection. The invention employs at least two different kinds of transforms, selectively encodes an output signal having the highest energy level in a low frequency domain and thereby achieves the effect of maximizing an encoding efficiency.

Although the invention has been described in detail with reference to its preferred embodiment, it will be understood by one of ordinary skill in the art that various modifications can be made, without departure from the spirit and scope of the invention.

What is claimed is:

1. A device for encoding transmission signals through adaptive selection of different transforms, comprising:

transforming means, having at least two different transforms, each of which performs a different type of transform operation on an input signal, providing a plurality of respective transformed data signals;

energy detection means coupled to said transforming means for detecting respective energy levels representing each of said transformed data signals and for outputting a selection signal indicative of the transformed data signal having a highest energy level; and a multiplexer for receiving said plurality of transformed data signals and said selection signal and for selectively outputting a transformed signal in accordance with said received signals.

2. A device for encoding as defined in claim 1, wherein said energy detection means detects each of said energy levels based on a coefficient of an energy detection domain corresponding to a low frequency component of the respective transformed data signal.

3. A device for encoding as defined in claim 1, further comprising time delaying means, connected between said transforming means and said multiplexer, for compensating for a time required by said energy detection means to calculate said energy levels.

4. A device for encoding as defined in claim 1, further comprising means for transmitting said transformed signal selected by said multiplexer and for transmitting said selection signal.

5. A device for encoding as defined in claim 1, wherein said energy detection means detects said energy level of each transformed data signal based on the following equation:

$$EPE = \frac{\sum_{u=0}^{M-1} \sum_{v=0}^{M'-1} E[F(u, v)]}{\sum_{u=0}^{N-1} \sum_{v=0}^{N'-1} E[F(u, v)]}$$

where, $E[F(u, v)]$ is an energy level for a transform coefficient $F(u, v)$, $u$ and $v$ represent domain coefficients, $M$, $M'$ represents a unit size of a portion of a transform domain corresponding to low frequency components of the input signal and $N$, $N'$ represents an entire transform domain.

6. A device for encoding according to claim 1, wherein said energy detection means calculates each of said energy levels based on a portion of a transform domain of a corresponding one of said at least two transforms, said portion of said transform domain corresponding to low frequency components of said input signal.

7. A device for encoding as defined in claim 1, wherein an input to said energy detection means receives solely said plurality of transformed data signals, such that said selection signal output from said energy detection means is obtained exclusively based upon said plurality of transformed data signals.

8. A device according to claim 1, wherein said transform operations are selected from the group consisting of a Discrete Cosine Transform, a Hadamard Transform, a Haar Transform, a Karhunen-Loeve Transform, and Block Truncation Coding.

9. A device according to claim 1, wherein said transform operations comprise a Discrete Cosine Transform, a Discrete Sine Transform, a Hadamard Transform, and a Haar Transform.

10. A decoding device that receives transmitted data and a selection signal, for decoding said transmitted data, comprising:

inverse transforming means, having at least two different inverse transforms, for inversely transforming said transmitted data and outputting at least two inversely transformed signals, each of which corresponds to one of said inverse transforms; and a multiplexer for outputting one of said inversely transformed signals based on said received selection signal.

11. A method for operating an apparatus for encoding transmission signals through adaptive selection of different transforms including N transformers operating in parallel, each of said N transformers performing a different transform to thereby output a respective transformed data signal, where N is an integer greater than one, and an energy detector receiving respective portions of said transformed data signals, said method comprising the steps of:

(a) generating said transformed data signals;

(b) generating a selection signal in response to said portions of said transformed data signals; and (c) transmitting a selected one of said transformed data signals in response to said selection signal.

12. The method as recited in claim 11, wherein said portions of said transformed data signals represent respective energy levels corresponding to a low frequency component of respective transformed data signals.

13. The method as recited in claim 11, wherein said transmitting step (c) further comprises the steps of:

(d) delaying said transformed data signals for a predetermined period of time; and (e) transmitting said selected one of said transformed data signals in response to said selection signal.

14. A method as recited in claim 11, wherein, in said generating step (b), said selection signal is generated exclusively in response to said portions of said transformed data signals.

15. A method according to claim 11, wherein said transforms are selected from the group consisting of a Discrete Cosine Transform, a Hadamard Transform, a Haar Transform, a Karhunen-Loeve Transform, and Block Truncation Coding.

16. A method according to claim 11, wherein said transforms comprise a Discrete Cosine Transform, a Discrete Sine Transform, a Hadamard Transform, and a Haar Transform.

* * * * *